US008185371B2

(12) United States Patent
Bhanji et al.

(10) Patent No.: US 8,185,371 B2
(45) Date of Patent: May 22, 2012

(54) MODELING FULL AND HALF CYCLE CLOCK VARIABILITY

(75) Inventors: Adil Bhanji, Wappingers Falls, NY (US); Sean Michael Carey, Hyde Park, NY (US); Jack Dilullo, Austin, TX (US); Prashant D Joshi, Austin, TX (US); Don Richard Rozales, Hyde Park, NY (US); Vern Anthony Victoria, Wappingers Falls, NY (US); Albert Thomas Williams, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 404 days.

(21) Appl. No.: 12/424,400

(22) Filed: Apr. 15, 2009

(65) Prior Publication Data

US 2010/0268522 A1    Oct. 21, 2010

(51) Int. Cl.
| | |
|---|---|
| G06F 17/50 | (2006.01) |
| G06F 9/44 | (2006.01) |
| G06F 13/10 | (2006.01) |
| G06F 13/12 | (2006.01) |
| G06F 1/00 | (2006.01) |
| G06F 9/455 | (2006.01) |

(52) U.S. Cl. ............ 703/19; 703/21; 713/501; 716/108; 716/113

(58) Field of Classification Search .................... 703/19, 703/21; 713/500–501; 716/108–113
See application file for complete search history.

(56) References Cited

U.S. PATENT DOCUMENTS

| | | | |
|---|---|---|---|
| 5,771,375 A * | 6/1998 | Mains | 713/503 |
| 6,288,589 B1 | 9/2001 | Potter | |
| 6,448,835 B1 | 9/2002 | Douskey | |
| 7,853,912 B2 * | 12/2010 | Binder et al. | 716/113 |
| 2003/0070150 A1 * | 4/2003 | Allen et al. | 716/6 |
| 2004/0153980 A1 * | 8/2004 | Wilcox et al. | 716/4 |
| 2006/0182212 A1 | 8/2006 | Hwang | |
| 2006/0247906 A1 * | 11/2006 | Austin et al. | 703/16 |

OTHER PUBLICATIONS

Gattiker, Anne et al., "Timing Yield Estimation from Static Timing Analysis", 2001, IEEE.*
Michael, George, "PrimeTime Static Timing Analysis Tool", Fall 2006, George Mason University.*
Hwang, Chanseok, et al., "Timing-Driven Placement Based on Monotone Cell Ordering Constraints", Nov. 19, 2005, Department of Electrical Engineering-Systems, University of Southern California.*

(Continued)

*Primary Examiner* — Paul Rodriguez
*Assistant Examiner* — Cedric D Johnson
(74) *Attorney, Agent, or Firm* — Matt Talpis; Mark P Kahler

(57) ABSTRACT

A modeling system includes a processor with software that performs static timing analysis (STA) on a design model. STA software executes a static timing analysis (STA) run with shortened clock cycles to model full cycle clock variability. Designers or other entities interpret the results of the shortened STA run data by performing modeling on the output data to generate slack data for design model data paths. STA software executes an STA run with an extended clock cycle to automatically separate half cycle data path (HCDP) slack data from full cycle data path (FCDP) slack data. The full and half cycle clock variability method may automatically adjust slack data for all half cycle data paths (HCDP)s to account for the additional half cycle variation (AHCV) and half cycle clock edge variability that may penalize the design model results in a real hardware implementation.

20 Claims, 6 Drawing Sheets

OTHER PUBLICATIONS

Mains, Robert E. et al., "Timing Verification and Optimization for the PowerPC Processor Family", 1994, IEEE.*

Fields—"Slack: Maximizing Performance Under Technological Constraints"—29$^{th}$ International Symposium on Computer Architecture ISCA, pp. 1-12 (Apr. 2002).

Lee—"Cycle Error Correction in Asynchronous Clock Modeling for Cycle-Based Simulation"—39$^{th}$ Annual IEEE/ACM International Symposium on Microarchitecture, pp. 1-18 (Jan. 2006).

Schweizer—"Exploiting Slack Time in Dynamically Reconfigurable Processor Architectures"—ternational Symposium on Computer Architecture (ISCA-34) Intel Microarchitecture Research lab (MRL), pp. 1-4 (Jun. 2007).

Soo—"Jitter Measurement Techniques"—Pericom Appication Brief AB36, pp. 1-3 (Nov. 2000).

* cited by examiner

METHOD OF TO GENERATE NORMALIZED SLACK DATA

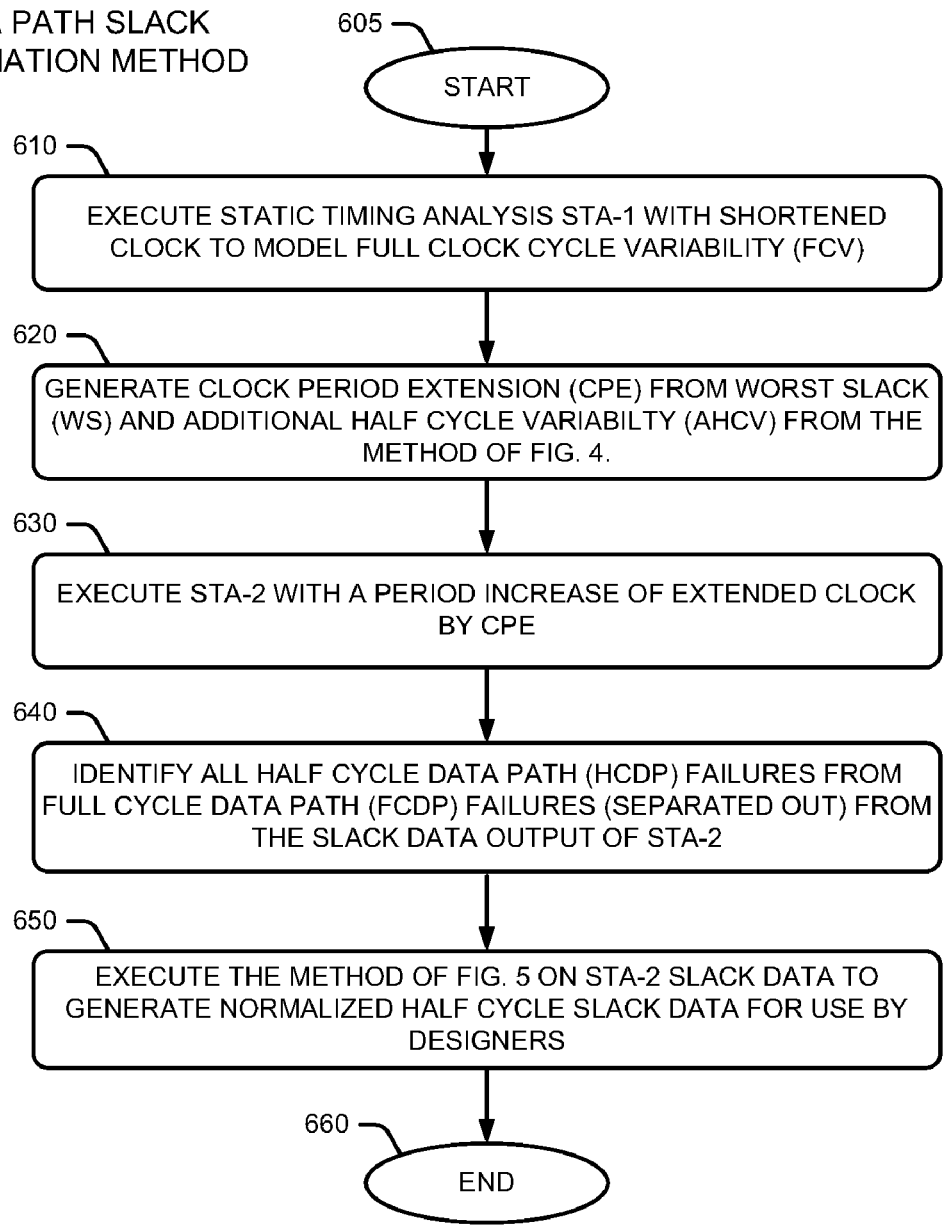

MODELING FULL AND HALF CYCLE CLOCK VARIABILITY

This invention was made with United States Government support under Agreement No. HR0011-07-9-0002 awarded by DARPA. The Government has certain rights in the invention.

BACKGROUND

The disclosures herein relate generally to processors, and more specifically, to processors that employ clock cycle variability software for design modeling and analysis.

Modern information handling systems (IHSs) often encounter significant design model evaluation testing and analysis prior to implementation in hardware. One such test is the high frequency clock verification of digital design models. Designers or other entities must take into account clock jitter and duty cycle variability when performing clock frequency verification tests, such as a static timing analysis (STA) on design models. Designers evaluate a particular hardware design to determine if clock jitter, duty cycle variability, and other factors cause the hardware design to function with good or bad results at desirable clock frequencies.

One method that designers use for clock frequency verification is a storage element and slack analysis of the devices of a hardware design. In this case, designers generate a design model of a hardware design that includes data paths of devices in the hardware design. A data path may employ a series of devices that launch a particular data bit, pass that data bit through one or more delay devices, and capture that data bit at the end of the data path with a final storage element. In this manner, STA software may generate slack data for each data path of the design model during STA evaluation. Slack is the measure of the amount of margin in time that a particular data path exhibits for a particular clock frequency, such as that of a main clock for data that propagates through that particular data path. The evaluation of half and full cycle data paths is critical to modern hardware design. A half cycle data path is a data path that employs a pulse width of one half cycle of the main clock during STA evaluation. A full cycle data path is a data path that employs the main clock full period or full cycle during STA evaluation.

BRIEF SUMMARY

Accordingly, in one embodiment, a method of modeling half cycle clock variation is disclosed that includes performing, by a static timing analyzer, a first static timing analysis (STA-1) on a design model that includes a launch storage element (LSE) and a capture storage element (CSE) with combinational logic therebetween. The design model includes full cycle data paths and half cycle data paths. A main clock signal is applied to the launch storage element (LSE) and the capture storage element (CSE). The first static timing analysis (STA-1) is performed using a shortened clock period to model full clock cycle variability (FCV) to provide slack information including worst case slack information (WS) and half clock cycle variability information (HCV). The method also includes determining, by the static timing analyzer, a clock period extension (CPE) value from the worst case slack (WS) information and the half clock cycle variability (HCV) information. The method further includes performing, by the static timing analyzer, a second static timing analysis (STA-2) using the clock period extension (CPE) value applied to the main clock signal to generate an extended clock signal and corresponding second static timing analysis (STA-2) slack information. The method still further includes identifying, by the static timing analyzer, failing half cycle data paths from the second static timing analysis (STA-2) slack information.

In another embodiment, a modeling system is disclosed that includes a processor. The modeling system also includes a memory store that is coupled to the processor. The memory store is configured to perform a first static timing analysis (STA-1) on a design model that includes a launch storage element (LSE) and a capture storage element (CSE) with combinational logic therebetween, the design model including full cycle data paths and half cycle data paths, a main clock signal being applied to the launch storage element (LSE) and the capture storage element (CSE), wherein the first static timing analysis (STA-1) is performed using a shortened clock period to model full clock cycle variability (FCV) to provide slack information including worst case slack information (WS) and half clock cycle variability information (HCV). The memory store is also configured to determine a clock period extension (CPE) value from the worst case slack (WS) information and the half clock cycle variability (HCV) information. The memory store is further configured to perform a second static timing analysis (STA-2) using the clock period extension (CPE) value applied to the main clock signal to generate an extended clock signal and corresponding second static timing analysis (STA-2) slack information. The memory store is still further configured to identify failing half cycle data paths from the second static timing analysis (STA-2) slack information.

BRIEF DESCRIPTION OF THE DRAWINGS

The appended drawings illustrate only exemplary embodiments of the invention and therefore do not limit its scope because the inventive concepts lend themselves to other equally effective embodiments.

FIG. 6 is a flowchart that generates slack data output during process flow in the design model of FIG. 2 as it employs the disclosed clock variability modeling method.

DETAILED DESCRIPTION

Figure 1:
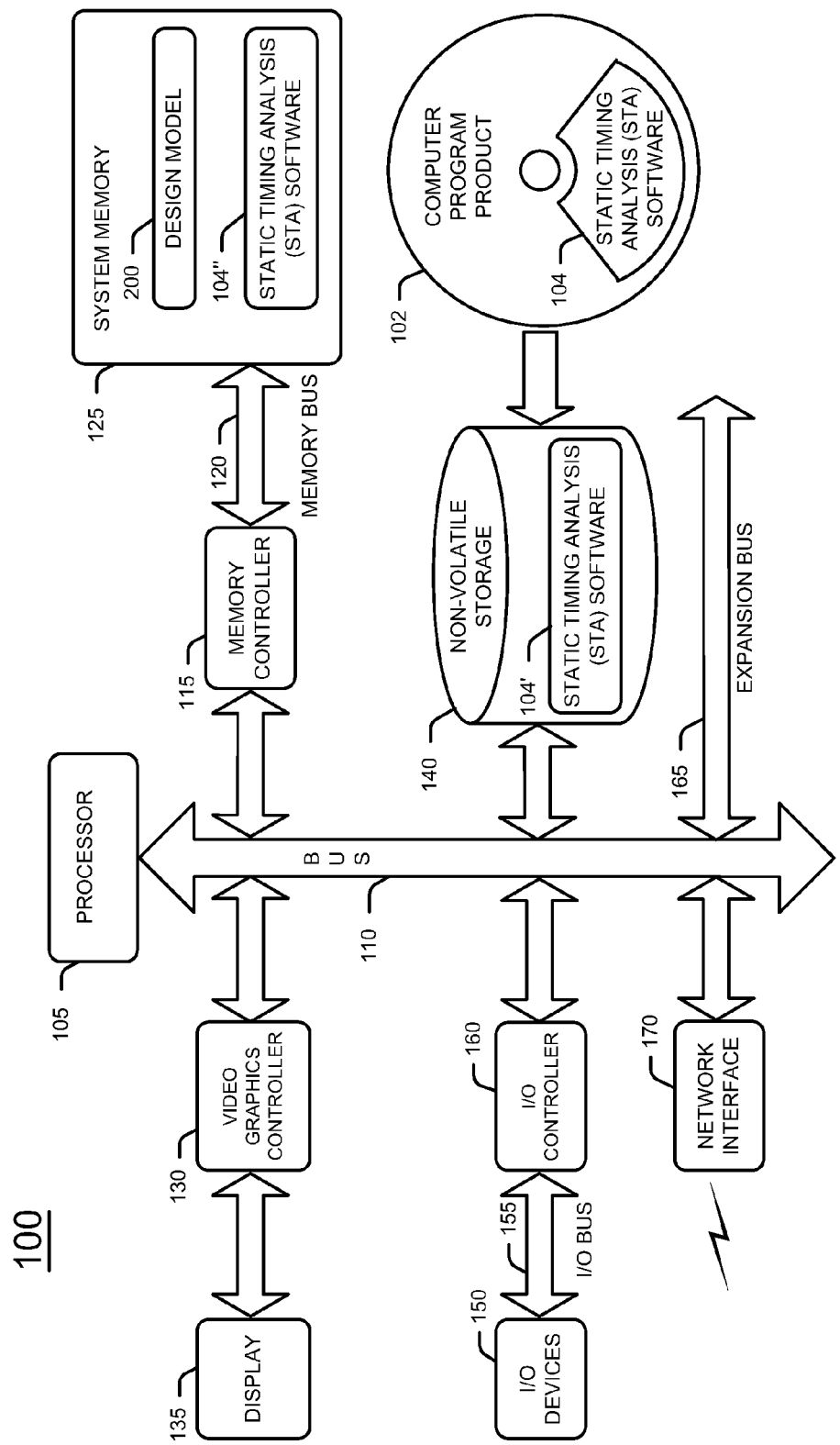
FIG. 1 is block diagram of an information handling system (IHS) that includes the disclosed clock variability modeling methodology.

One embodiment of the disclosed information handling system (IHS) employs a processor that executes static timing analysis (STA) software. The STA software generates slack data and performs other analysis of hardware design models for evaluation by designers and other entities. Clock jitter, duty cycle variability and other factors are of particular importance to designers of digital hardware designs. A particular clock signal that does not perfectly repeat in sequential timing from one leading or trailing edge to the next leading or trailing edge exhibits a "jitter" or movement in time from cycle to cycle. Moreover, duty cycle variability may cause the period of a design clock and/or the pulse width of that clock to vary from one cycle to the next.

In a design model, a data path describes the path that data takes through a hardware device when a particular main clock or other clock drives the hardware device. For example, one edge or transition of the clock may launch the data into a particular data path and another edge or transition of the same clock may capture the data of a particular data path. Half cycle data paths are those data paths that operate in no greater than one half (½) of the full clock cycle. Full cycle data paths are those data paths that operate in no greater than one full clock cycle. Designers benefit from a clear understanding and separation of half and full data path evaluation for any particular clock frequency. Table 1 below shows 4 examples of data path timing.

TABLE 1

| | |
|---|---|
| A | Launch data from rising clock edge and capture data at next rising edge |
| B | Launch data from falling clock edge and capture data at next falling edge |
| C | Launch data from falling clock edge and capture data at next rising edge |
| D | Launch data from rising clock edge and capture data at next falling edge |

As Table 1 above describes, the data path of case A is a full cycle data path (FCDP) as described in more detail below. Case B also represents a full cycle data path FCDP. Case C of Table 1 describes a half cycle data path (HCDP). Case D also describes a half cycle data path HCDP. Cycle to cycle clock variability will affect the timing and slack data for path cases A and B. Clock pulse width variability will also affect the timing and slack data for path cases C and D. The clock cycle to cycle and pulse width variability may differ from clock cycle to clock cycle for a given clock. Some STA software programs model cycle to cycle variability and pulse width variability as constants and do not provide a clear separation for evaluation of half and full cycle data paths.

In one embodiment of the disclosed method, STA software provides designers with independent evaluation of pulse width and cycle to cycle variability modeling. In this manner, STA software may separate half cycle data path HCDP and full cycle data path FCDP slack data and other information for evaluation by designers and other entities. Designers or other entities may ensure that both half and full cycle data paths balance with each other. In other words, to optimize design hardware clock operating frequencies, designers may not over-design (make faster) either half or full cycle data paths at the cost of slowing down the other data path type. For example, if a full cycle data path FCDP is slower than the design clock frequency by 10 picoseconds (ps), then designers may relax (increase) the clock frequency by 10 ps for that FCDP to operate at the operating frequency. However, if a half cycle data path HCDP is too long by 10 ps, designers may require that the clock period relax by 20 ps in order for that HCDP to operate properly.

Designers or other entities may employ static timing analysis STA software to generate slack data and other analysis of design models of potential future hardware systems. In a design model, each device exhibits delay characteristics. A design model includes the organization of storage elements and delay devices to model the timing characteristics of a particular hardware design, such as a digital hardware design or circuit. An STA run or execution does not require simulation and thus does not require costly simulation time to generate results. For most data paths, a launch storage element, a series of delay devices and a capture element sufficiently model the actual hardware for the design model. In other embodiments, a design model may employ a transparent storage element or other device to properly model the hardware design. A transparent storage element captures data and propagates that data while a clock signal is active. In a transparent storage element, data can propagate after a clock rising edge element.

FIG. 1 shows a modeling information handling system (IHS) as a modeling system 100 that may employ the disclosed clock variability modeling method. In that case, the modeling system 100 carries out the functional blocks of the flowcharts of FIGS. 4 through 6, described below, that apply to the clock variability modeling process. Modeling IHS 100 includes a computer program product 102, such as a media disk, media drive or other media storage. Modeling IHS 100 includes a static timing analyzer, such as static timing analysis STA software 104 that enables processors and other entities to evaluate slack data for design data paths. Modeling IHS 100 includes a processor 105 that couples to a bus 110. A memory controller 115 couples to bus 110.

A memory bus 120 couples system memory 125 to memory controller 115. System memory 125 is a form of memory store. System memory 125 includes a design model 200 that provides design characteristics for analysis by STA software 104. A video graphics controller 130 couples display 135 to bus 110. Modeling IHS 100 includes nonvolatile storage 140, such as a hard disk drive, CD drive, DVD drive, or other nonvolatile storage that couples to bus 110 to provide modeling IHS 100 with permanent storage of information. Nonvolatile storage 140 is a form of data store. I/O devices 150, such as a keyboard and a mouse pointing device, couple via an I/O bus 155 and an I/O controller 160 to bus 110.

One or more expansion busses 165, such as USB, IEEE 1394 bus, ATA, SATA, eSATA, PCI, PCIE and other busses, couple to bus 110 to facilitate the connection of peripherals and devices to modeling system 100. A network interface 170 couples to bus 110 to enable IHS 100 to connect by wire or wirelessly to other network devices. IHS 100 may take many forms. For example, modeling system 100 may take the form of a desktop, server, portable, laptop, notebook, or other form factor computer or data processing system. Modeling IHS 100 may also take other form factors such as a personal digital assistant (PDA), a gaming device, a portable telephone device, a communication device or other devices that include a processor and memory.

Modeling IHS 100 may employ a compact disk (CD), digital versatile disk (DVD), floppy disk, external hard disk or virtually any other digital storage medium as medium 102. Medium 102 stores software including STA software 104 thereon. A user or other entity installs software such as STA software 104 on IHS modeling 100 prior to usage of this application. The designation, STA software 104', describes STA software 104 after installation in non-volatile storage 140 of modeling IHS 100. The designation, STA software 104", describes STA software 104 after IHS 100 loads the static timing analysis software into system memory 125 for execution.

Those skilled in the art will appreciate that the various structures disclosed, such as those of STA software 104 may be implemented in hardware or software. Moreover, the methodology represented by the blocks of the flowcharts of FIGS. 4 through 6 may be embodied in a computer program product, such as a media disk, media drive or other media storage such as computer program product medium 102 of FIG. 1.

In one embodiment, the disclosed methodology is implemented as STA software 104, namely a set of instructions (program code) in a code module which may, for example, be resident in the system memory 125 of modeling IHS 100 of FIG. 1. Until required by IHS 100, the set of instructions may be stored in another memory, for example, non-volatile storage 140 such as a hard disk drive, or in a removable memory such as an optical disk or floppy disk, or downloaded via the Internet or other computer network. Thus, the disclosed methodology may be implemented in a computer program product for use in a computer such as IHS 100. It is noted that in such a software embodiment, code which carries out the functions described in the flowchart of FIGS. 4 through 6 may be stored in RAM or system memory 125 while such code is being executed. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

Figure 2:
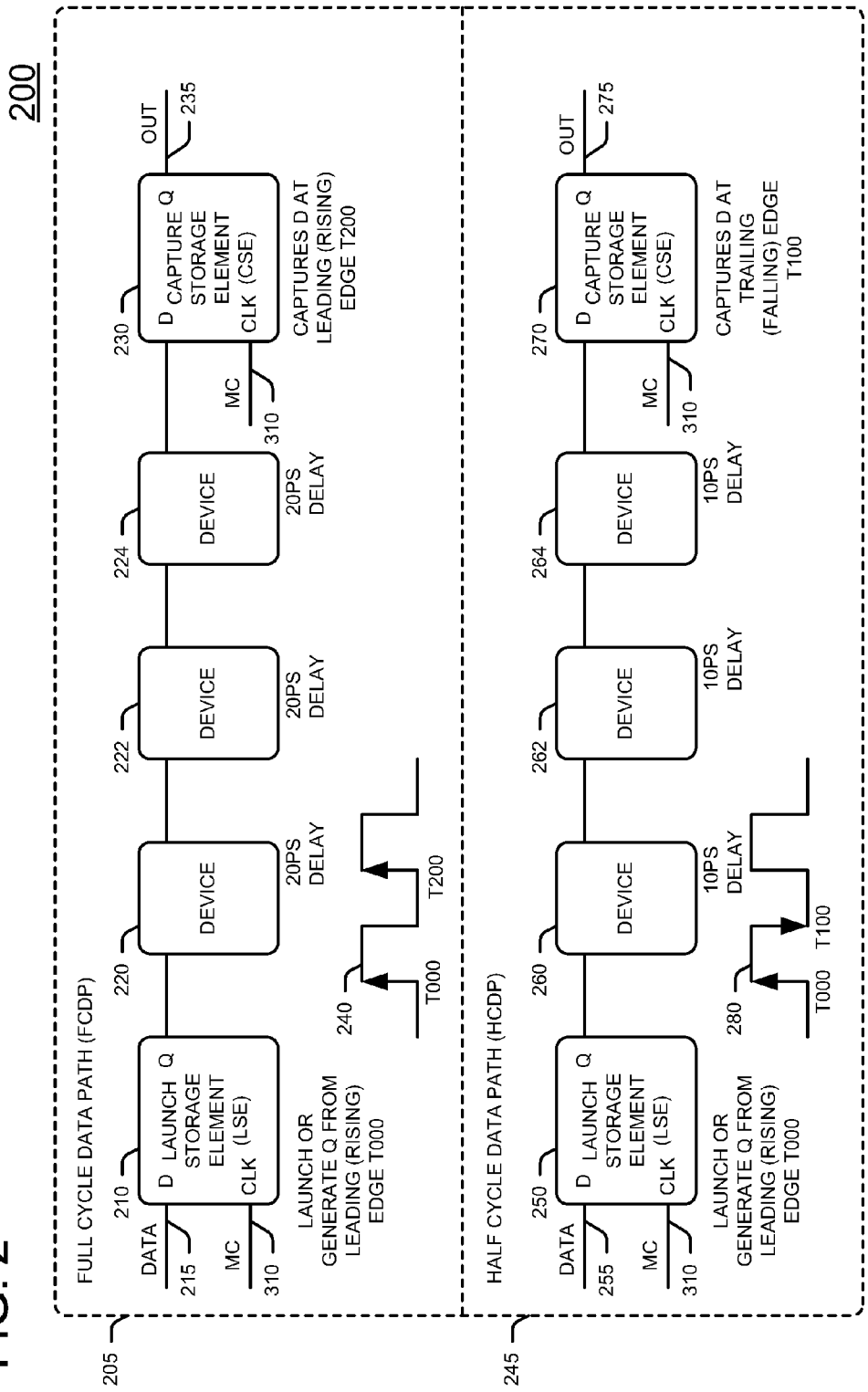
FIG. 2 is a block diagram showing detail of the design model half and full cycle data paths that employ the disclosed clock variability modeling methodology.

FIG. 2 shows a design model 200 that modeling IHS 100 may employ during the execution of the disclosed clock variability modeling method. Design model 200 includes a full cycle data path (FCDP) 205 at the top of FIG. 2. FCDP 205 may be one of multiple full cycle data paths within design model 200. FCDP 205 includes a launch storage element (LSE) 210. LSE 210 may be a latch or other device that propagates a data input at D of LSE 210 to an output Q of LSE 210 in response to a clock input CLK. In one embodiment, a transparent storage element may replace LSE 210. In one embodiment, LSE 210 receives a data input signal DATA 215 at the D input of LSE 210 and a master or main clock input signal MC 310 at the CLK input of LSE 210. LSE 210 may launch or otherwise generate output Q data from the leading or rising edge of main clock input MC 310. In other embodiments, LSE 210 may launch on the trailing or falling edge of MC 310. LSE 210 generates an output signal at the Q output of LSE 210 that couples to the input of a device 220.

Device 220 may be a combinational logic device of multiple functions, such as AND, OR, or other binary devices. Device 220 generates a particular delay for the data from the output of LSE 210. In one embodiment, device 210 generates a delay of 20 picoseconds (ps) from the data output of LSE 210 to the output of device 220. The output of device 220 couples to the input of a device 222. The output of device 222 couples to the input of a device 224. In one embodiment, device 222 and device 224 each generate a delay of 20 ps. The output of device 224 couples to the D input of a capture storage element (CSE) 230. CSE 230 captures the output data from device 224 at the D input of CSE 230 during the rising edge of MC 310 at the CLK input of CSE 230. CSE 230 generates an output data signal OUT 235 at the Q output of CSE 230 after the rising edge of MC 310. In one embodiment, a transparent storage element may replace CSE 230.

In one embodiment of the disclosed method, a main or master clock as shown by timing signal 240, generates a rising edge at time 0 or T000. That rising edge clocks the data of LSE 210. In one embodiment, design model 200 employs timing signal 240 as a main clock signal MC 310. The main clock signal, namely MC 310 exhibits a total period of 200 ps. Main clock signal MC 310 clocks CSE 230 at time 200 ps or T200. In this manner, a particular DATA signal 215 launches from LSE 210 at time T000 plus the propagation delay through LSE 210. CSE 230 captures the output data from device 224 for output at T200 plus the delay through CSE 230, thereby generating output signal OUT 235. In this example for a full cycle data path FCDP 205, the storage elements, LSE 210 and CSE 230 trigger or clock on the rising edge of MC signal 310. In other embodiments, the storage elements, LSE 210 and CSE 230 may trigger or clock on the falling edge of a clock signal such as MC 310. In that negative clock circuit case, storage elements LSE 210 and CSE 230 may trigger or clock data for propagation on the falling edge of MC 310. Other logic (not shown) of design model 200 may generate DATA signal 215 and MC signal 310.

Design model 200 includes a half cycle data path (HCDP) 245 at the bottom of FIG. 2. HCDP 245 may be one of multiple half cycle data paths within design model 200. HCDP 245 includes a launch storage element (LSE) 250. LSE 250 may be a latch or other device that propagates data at data input D of LSE 250 to output Q of LSE 250 in response to a timing signal at the clock input CLK of LSE 250. In one embodiment, LSE 250 receives a data input signal DATA 255 at the D input of LSE 250 and a main clock input signal MC 310 at the CLK input of LSE 250. LSE 250 may launch or otherwise generate output Q data from the leading or rising edge of the MC signal 310. In other embodiments, LSE 250 may launch on the trailing or falling edge of the MC signal 310. LSE 250 generates an output signal at the Q output of LSE 250 that couples to the input of a device 260.

Device 260 may be a combinational or multi-functional device, such as AND, OR, or other binary devices. Device 260 provides a particular delay to the data from the output of LSE 250. In one embodiment, device 260 generates a delay of 10 picoseconds (ps) from the Q output of LSE 250 to the output of device 260. The output of device 260 couples to the input of a device 262. Device 262 provides a data delay of 10 ps to the half cycle data path. The output of device 262 couples to the input of a device 264. In one embodiment, device 260, device 262 and device 264 each provide a delay of 10 ps to the half cycle data path HCDP 245. The output of device 264 couples to the D input of a capture storage element (CSE) 270. CSE 270 captures the output data from device 264 at the D input of CSE 270 during the trailing or falling edge of MC signal 310 at the CLK input of CSE 270. CSE 270 generates an output data signal OUT 275 at the Q output of CSE 270 after the trailing edge of the main clock signal MC 310.

In one embodiment of the disclosed method, a main clock signal as shown by timing signal 280 generates a rising edge at time 0 or T000. That rising edge triggers or clocks the data of LSE 250. The main clock exhibits a total half cycle pulse width of 100 ps and clocks CSE 270 at time=100 ps or T100. In that manner, a particular DATA signal 255 launches from LSE 250 at T000 plus the delay through LSE 250. CSE 270 captures the output data from device 264 for output at T100 plus the delay through CSE 270, thereby generating output signal OUT 275. In this example for a half cycle data path HCDP 245, the storage elements LSE 250 and CSE 270 trigger or clock on the rising and falling edge respectively. In other embodiments, the storage elements, LSE 250 and CSE 270 may trigger or clock on the falling and rising edges respectively of a clock signal such as main clock MC 310. In that negative clock circuit case, storage element LSE 250 launches data on the trailing or falling edge of the MC signal 310, and CSE 270 captures data on the rising edge of MC signal 310. Other logic (not shown) of design model 200 may generate DATA signal 255 and MC signal 310.

The output signal, such as OUT 235, and OUT 275 of a particular data path, such as FCDP 205 or HCDP 245, respectively, may flow to the input of other data paths of design model 200 not shown. In other words, the output of one data path may couple to the input of another data path (not shown) of design model 200. Design model 200 may include multiple data paths not shown. Design model 200 may employ multiple data paths in series and parallel configurations to generate complex circuit models. During the execution of a static timing analysis (STA), a processor such as processor 105, executes a static timing analysis STA of design model 200. That STA includes each data path with their respective storage elements and device delay information.

One key function of an STA run or execution is the determination of which data signals of a particular data path fail to meet slack timing requirements. For example, a particular data signal transfer from a launch storage element, such as LSE 250 to a corresponding capture storage element, such as CSE 270 for a particular data path, such as HCDP 245 may fail due to improper slack timing. In one example, a data signal for any particular data path may not propagate from the launch storage element to the capture storage element in sufficient time for the capturing clock signal of a particular clock configuration. In that example, that particular data path exhibits insufficient slack for that particular clock configuration. In other words, that particular data path is a failure for that particular clock configuration. Identifying and sorting potential failure data paths by slack data of design model 200, is one significant feature of a static timing analysis STA that STA software 104 performs.

Timing signal 240 and timing signal 280 depict one example of a main clock signal MC 310 that design model 200 employs during a particular STA. Although storage elements of FCDP 205 and HCDP 245 trigger, clock, or otherwise store data at different edges of MC 310, timing signal 240 and timing signal 280 both represent the same clock signal. In this case, the timing signal is a main clock signal MC 310 with a half cycle pulse width of 100 ps and a full cycle period of 200 ps. During STA execution, designers may modify the pulse width and cycle period characteristics of MC 310 to test various parameters of design model 200. A designer may analyze data slack information critical to the performance of design model 200 after the execution of STA software, such as STA software 104.

Figure 3:
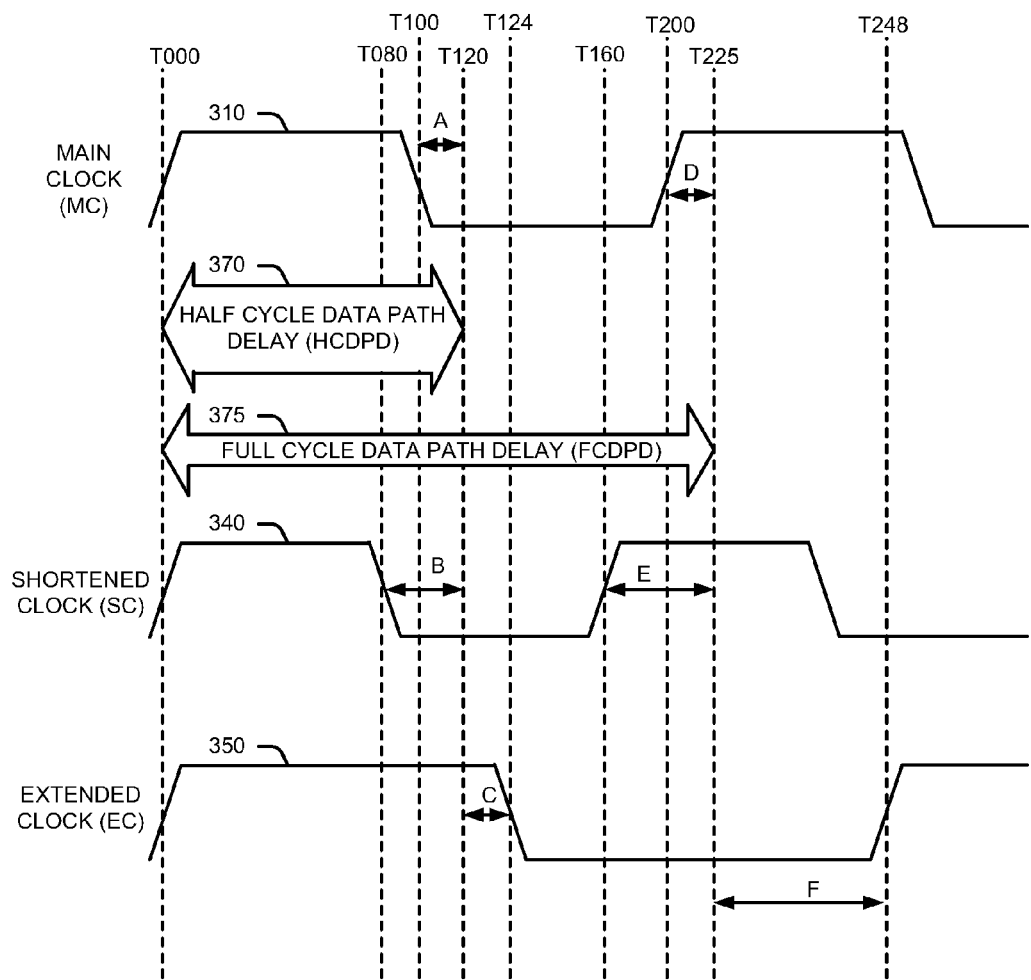
FIG. 3 is a timing diagram that depicts clock waveforms that the IHS of FIG. 1 employs in the disclosed clock variability modeling methodology.

FIG. 3 shows more detail of timing or clock signals that design model 200 employs during a static timing analysis STA run. In one embodiment, main clock MC 310 is an ideal clock signal that exhibits a full cycle period of 200 picoseconds (ps), and a duty cycle or pulse width of 100 ps. The MC signal 310 generates a rising edge or trigger point at time 0 or T000 as shown by the leftmost dotted vertical line in FIG. 3. T000 is a threshold or trigger point that identifies the point in time that a particular storage element of design model 200 initiates either a launch or capture of data. For example, in half cycle data path HCDP 245, the rising edge of the MC signal 310 triggers or otherwise launches DATA signal 255 at launch storage element LSE 250 at T000. The falling edge of MC signal 310 triggers or otherwise captures data at capture storage element CSE 270 at T100. CSE 270 captures data for generation of output signal OUT 275 at T100 plus the delay through CSE 270.

Main clock signal MC 310 rises again at T200 and repeats as necessary with a 200 ps period for any particular STA. For a full cycle data path, such as FCDP 205, T000 represents the particular point in time relative to the MC signal 310 that LSE 210 launches or presents input data, namely DATA signal 215 at the Q output of LSE 210. Conversely, T200 represents the period in time relative to the MC signal 310 that CSE 230 captures input data, namely the output data from device 224, to product output data signal OUT 235 at the output of CSE 230. For a half cycle data path, such as HCDP 245, T000 represents the point in time relative to the MC signal 310 that LSE 250 initiates a launch or transfer of input data, namely the DATA signal 255, to the Q output of LSE 250. Conversely, T100 represents the period in time relative to MC 310 that CSE 270 captures input data, namely the output data from device 264 to generate output data signal OUT 275 at the output of CSE 270.

In an ideal scenario, data such as DATA signal 255 propagates from LSE 250 through each delay device 260, device 262, device 264, and arrives at the input of CSE 270 with adequate guard or setup time prior to the triggering clock edge of MC signal 310 at the clock input of CSE 270. However, as STA runs may identify in differing scenarios, the DATA signal 255 may not propagate with adequate slack. In that case a half cycle data path, such as HCDP 245 may fail during execution of STA software 104. As described in more detail below, STA software 104 may execute a STA on design model 200 with a shortened clock signal SC 340 of MC 310. As shown in FIG. 3, SC 340 is a timing clock signal that demonstrates a shortened or reduced clock period of MC 310.

In one embodiment, the pulse width of SC signal 340 is 80 ps as shown by the falling edge at T080 in FIG. 3. The full cycle clock period of SC signal 340 is 160 ps as shown by the rising edge at T160. During execution of STA on design model 200, STA software 104 may reduce MC signal 310 timing to generate or model the signal 340. STA software 104 may execute with SC signal 340 to assist in the identification of marginal or susceptible data paths. Data paths, such as HCDP 245, may be subject to failure from improper slack characteristics or other design parameters. SC 340 is one example of a shortened MC signal 310 that demonstrates full cycle variability in design model 200. In other words, STA software 104 may test the variability, jitter, fluctuation, or other changes in the MC signal 310 by using a SC signal 340 during testing and analysis of design model 200 data paths.

As described in more detail below, STA software 104 may execute a STA on design model 200 using an extended clock EC signal 350 for MC signal 310. EC 350 is a timing clock signal that exhibits an extended or lengthened clock period for MC signal 310. In one embodiment, the pulse width of EC 350 is 124 ps as shown by the falling edge at T124. The full cycle clock period of EC 350 is 248 ps as shown by the rising edge at T248. During execution of STA on design model 200, STA software 104 may extend the timing of the MC signal 310 to generate or model the EC signal 350. STA software 104 may execute using the extended clock signal EC 350 to help identify failing half cycle data paths. For example, data path HCDP 245 may demonstrate the poorest or worst slack data of other half cycle data paths of design model 200. The extended clock signal EC 350 is one example of an extended MC signal 310 that exhibits full cycle variability in design model 200. In other words, STA software 104 may test the variability, jitter, fluctuation, or other changes in the MC signal 310 by using the extended clock signal EC 350 during testing and analysis of design model 200 data paths.

FIG. 3 shows a half cycle data path delay HCDPD 370 as a horizontal arrow that represents the data delay of the DATA signal 255 through the half cycle data path HCDP 245. In one embodiment, HCDPD 370 employs a data signal DATA 255 that launches at LSE 240 at time T000 and presents at the input of CSE 270 at time T120. Ideally, the data signal DATA 255 launches at LSE 250 at time T000 and propagates through device 260, device 262, and device 264 to arrive at the input of CSE 270 for capture at no later than time T100. However in the case as shown in FIG. 3, the DATA signal 255 arrives at the input of CSE 270 at T120, or 20 ps late. This condition is a slack of negative 20 or (−20). A negative slack indicates a potential failure data path, such as the data path of HCDP 245. The difference in time between the actual arrival of the DATA signal 255 at the input of CSE 270 and the latest allowable arrival time is shown in FIG. 3 by "A" as (−20) ps representing the slack for HCDP 245 during execution of MC 310 on design model 200.

STA software 104 may evaluate HCDPD 370 in other clock scenarios than MC 310. For example, STA software 104 may evaluate the HCDPD 370 of HCDP 245 with the execution of shortened clock signal SC 340. In that case, the HCDP 245 slack for shortened clock SC 340 is shown by "B" in FIG. 3. In other words, the slack for HCDPD 370 is a negative slack of 40 ps or (−40) ps in the case of STA software 104 analysis of design model 200 employing shortened clock signal SC 340. This condition demonstrates a slack even worse, namely (−40) ps for HCDPD 370, than in the case of MC 310 analysis that demonstrates a slack of (−20) ps.

In another clock scenario, STA software 104 may evaluate the HCDPD 370 of HCDP 245 with the execution of extended clock EC 350. In that case, the HCDP 245 slack for extended clock EC 350 is shown by "C" in FIG. 3. In other words, the slack for HCDPD 370 is a positive slack of 4 ps in the case of STA software 104 analysis of design model 200 employing EC 350. This condition demonstrates a better condition or better slack, namely (+4) ps for HCDPD 370, than in the case of MC 310 analysis that indicated a slack of (−20) ps. In the scenario wherein STA software 104 executes MC 310 on design model 200, HCDP 245 exhibits a negative slack of 20 ps or "A" as shown by HCDPD 370 arriving at T120 instead of T100, the falling edge of MC 310. In the scenario wherein STA software 104 executes while using the SC signal 340 on design model 200, HCDP 245 exhibits a negative slack of 40 ps or "B", as shown by HCDPD 370 arriving at T120 instead of T080, the falling edge of SC 340. In the scenario wherein STA software 104 executes while using the EC signal 350 on design model 200, HCDP 245 exhibits a positive slack of 4 ps or "C" as shown by HCDPD 370 arriving at T120 instead of T124, the falling edge of EC 350.

FIG. 3 further shows a full cycle data path delay FCDPD 375 as a horizontal arrow that represents the data delay of DATA signal 215 through FCDP 205. In one embodiment, FCDPD 375 employs a data signal DATA 215 that launches at LSE 210 at time T000 and presents at the input of CSE 230 at time T225. Ideally, the data signal DATA 215 launches at LSE 210 at T000 and propagates through device 220, device 222, and device 224 to arrive at the input of CSE 230 for capture at no later than time T200. However in the case as shown in FIG. 3, DATA 215 arrives at the input of CSE 230 at T225, or 25 ps late. This condition is a slack of negative 25 or (−25). A negative slack indicates a potential failure data path, such as the data path of FCDP 205. The difference in time between the actual arrival of DATA signal 215 at CSE 230 and the ideal arrival time is shown by "D" as 25 ps delay representing a slack of (−25) ps for FCDP 205 during execution of MC 310 on design model 200.

STA software 104 may evaluate FCDPD 375 in other clock scenarios than using MC signal 310. For example, STA software 104 may evaluate FCDPD 375 of FCDP 205 with the execution of the shortened clock signal SC 340. In that case, the FCDP 205 slack for shortened clock SC 340 is shown by "E" in FIG. 3. In other words, the slack for FCDPD 375 is a negative slack of 65 ps or (−65) ps in the case of STA software 104 analysis of design model 200 employing SC 340. This condition indicates a slack, namely (−65) ps for FCDPD 375, that is worse than in the case of MC 310 analysis that indicated a slack of (−25) ps.

In another clock scenario, STA software 104 may evaluate FCDPD 375 of FCDP 205 by executing using the extended clock signal EC 350. In that case, the FCDP 205 slack for extended clock EC 350 is shown by "F" in FIG. 3. In other words, the slack for FCDPD 375 is a positive slack of 23 in the case of STA software 104 analysis of design model 200 employing EC 350. This condition indicates a better condition or better slack, namely 23 ps for FCDPD 375, than in the case of MC signal 310 analysis that indicated a slack of −25 ps. In the scenario wherein STA software 104 executes using the MC signal 310 on design model 200, FCDP 205 exhibits a negative slack of 25 ps or "D" as shown by FCDPD 375 arriving at T225 instead of T200, the second rising edge of MC 310. In the scenario wherein STA software 104 executes using the shortened clock SC signal 340 on design model 200, FCDP 205 exhibits a negative slack of 65 ps or "E" as shown by FCDPD 375 arriving at T225 instead of T160, the second rising edge of SC 340. In the scenario wherein STA software 104 executes using extended clock EC signal 350 on design model 200, FCDP 205 exhibits a positive slack of 23 ps or "F" as shown by FCDPD 375 arriving at T225 instead of T248, the second rising edge of EC 350.

STA software 104 executes using extended clock EC signal 350 on half cycle data paths of design model 200. As described in more detail below, that STA execution demonstrates one method to separate out or sort and identify the worst slack values for half cycle data paths of design model 200. In other words, by extending the main clock MC 310 by a predictable value, STA software 104 isolates failing half cycle data paths, such as HCDP 245 by identifying the worst slack data values for those data paths. Designers may use that slack data output of STA software 104 executing on design model 200 as input into hardware design modification or other actions.

Figure 4:
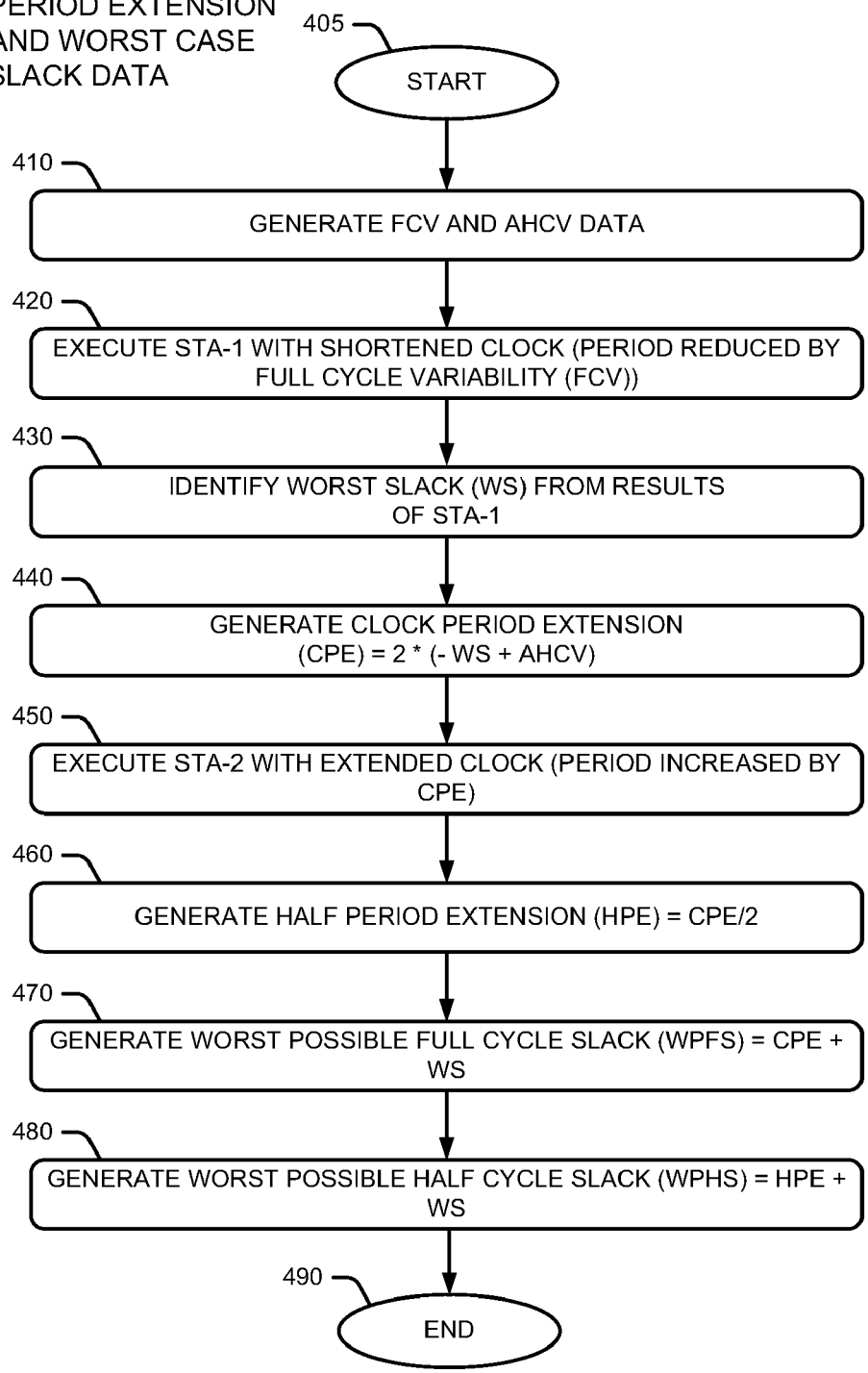
FIG. 4 is a flowchart that depicts process flow in the design model of FIG. 2 as it employs the disclosed clock variability modeling method.

FIG. 4 is a flowchart that further shows the generation of clock period extension CPE information and worst case slack information for the disclosed clock variability modeling method. The method starts, as per block 405. In one embodiment, a designer or other entity such as modeling IHS 100 determines full clock cycle variability (FCV) for a particular design model, such as design model 200, as equal to 25 ps. A designer may use modeling system 100 to generate the FCV data during analysis of design model 200 prior to the steps of the method depicted in FIG. 4. A designer may use modeling system 100 to determine a half clock cycle variation (HCV) for half cycle data paths that is in addition to the clock cycle variation penalties for full cycle data paths. In one embodiment, this additional half cycle variation (AHCV) penalty is equal to 14 ps. Modeling IHS 100 generates FCV and AHCV data, as per block 410. Designers may use modeling IHS 100 to determine FCV and AHCV from design analysis of design model 200 or other information. That data may reflect the clock variation that designers determine from analysis of design model 200 and clock oscillator characteristics or other information.

Modeling system 100 executes a static timing analysis (STA) run number 1, or STA-1 with a shortened clock by the amount of FCV, on IHS 100 as per block 420. The shortened clock SC 340 as shown above in FIG. 2 is a full clock cycle with a full clock cycle period of 200 ps minus FCV or 200−25=175 ps. In other words modeling system 100 executes STA-1 with a full cycle clock period of 175 ps. During that STA-1 run or execution, shortened clock SC 340 affects the full cycle data paths by the full reduction of 25 ps, whereas only ½ of that FCV reduction or a half cycle clock reduction of 12.5 ps affect the half cycle data paths of design model 200. A designer may use modeling system 100 to identify the worst case slack (WS) from the results of STA-1, as per block 430. The worst case slack WS is the worst case slack data of any particular data path of design model 200 from the results or execution of STA-1. For example, half cycle data path HCDP 245 may demonstrate a slack data value of negative 10 ps. That slack data value of (−10) ps may further demonstrate the worst case slack data for any data path including half and full cycle data paths of design model 200. In that case WS= (−10) ps. Modeling system 100 may determine the worst case slack WS from any particular worst case data path results of design model 200, including half cycle data paths, or full cycle data paths.

Modeling system 100 generates clock period extension (CPE) in accordance with Equation 1 below, as per block 440.

$$CPE=2*(-WS+AHCV) \qquad \text{EQUATION 1}$$

wherein CPE=clock period extension
WS=worst case slack
AHCV=additional half cycle variation (AHCV)

For example, if WS=−10, and AHCV=14, CPE=2*(10+14) =48. A designer executes a static timing analysis STA number 2, or STA-2 on design model 200 with an extended clock EC 350 on modeling IHS 100, as per block 450. The extended clock EC 350 is a clock such as main clock MC 310 with an extension of CPE. For example, the clock period of extended clock EC 350 corresponds to the clock period of main clock MC 310 plus CPE. In other words extended clock EC 350=200+48=248 ps. As shown in FIG. 3, EC 350 employs a clock cycle period of 248 ps. Modeling system 100 may determine the half period extension (HPE) using Equation 2 below, as per block 460.

$$HPE=CPE/2, \qquad \text{EQUATION 2}$$

wherein HPE=half period extension
CPE=clock period extension

For example, HPE=CPE/2=48/2=24. Modeling system 100 generates the worst case possible full cycle slack (WPFS) from Equation 3 below, as per block 470.

$$WPFS=CPE+WS, \qquad \text{EQUATION 3}$$

wherein WPFS=worst possible full cycle slack
CPE=clock period extension
WS=worst case slack For example, WPFS=CPE+WS=48+(−10)=38. WPFS demonstrates the worst case slack for any full cycle data path, such as FCDP 205. In other words during execution of STA-2 each full cycle data path would have a positive 38 slack or better. The extended clock EC 350 demonstrates a main clock MC 310 extended by 48 ps or the amount of CPE. The pulse width of extended clock EC 350 is extended by half of that or 24 ps. Each half cycle data path, such as HCDP 245 demonstrates an improvement in slack by 24 or HPE during a static timing analysis, such as STA-2. Modeling system 100 generates the worst possible half cycle slack (WPHS) from Equation 4 below, as per block 480.

$$WPHS=HPE+WS \qquad \text{EQUATION 4}$$

wherein WPHS=worst possible half cycle slack
HPE=half period extension
WS=worst case slack For example, If the worst case slack WS from the execution of STA-1 was (−10), the worst possible slack from the execution of STA-2 for a half cycle data path WPHS=HPE+ WS=24+(−10)=14 ps. During the execution of STA-2, slack data paths that reside within the region between WPFS and WPHS demonstrate two conditions. For example, any path with a slack data between 38 and 14 indicates each of the following two conditions. In the first condition, the paths should be half cycle data paths, such as HCDP 245, because any full cycle data path should have a slack no worse than WPFS (+38) ps as described in the example above. Therefore, the half cycle data paths sort at the lowest end of the slack data range (less positive slack) for STA-2. In the second of two conditions, the data path should be failing during execution of STA-1, because the margin of slack error shown as the additional half cycle variation AHCV=14. In other words, if HCDP 245 slack is less than 38, that means the HCDP 245 slack in STA-1 was less than 38−HPE or 14. HCDP 245 requires a slack of at least 14 in the original STA-1 to pass, due to the additional half cycle variation AHCV. The method that generates clock period extension CPE and worst slack information for the disclosed clock variability modeling ends, as per block 490.

The output slack data from the method of FIG. 4 provides a useful sorting of half cycle data path failures. Those half cycle data paths, such as HCDP 245, represent slack data failure information for the data paths of design model 200. In other words, the slack data as output from the method of FIG. 4 may represent a useful collection of half cycle data paths that designers or other entities may find practical for design improvement opportunities. However, the slack data as output of the method of FIG. 4 is not actual slack data, but rather an exaggeration of slack performance that both shortened clock SC 340 and extended clock EC 350 provide. In other words, the execution of STA-1 and STA-2 by IHS 100 provide exaggerated or non-real slack data performance for half cycle data paths, such as HCDP 245 and others. For example, half cycle data path STA-1 or STA-2 slack data results are potentially more positive than would be the case corresponding to actual hardware, due to half cycle clock variability. Designers may desire "real" or actual slack performance for each of those half cycle data path demonstrating slack failure, depending on the particular application.

Figure 5:
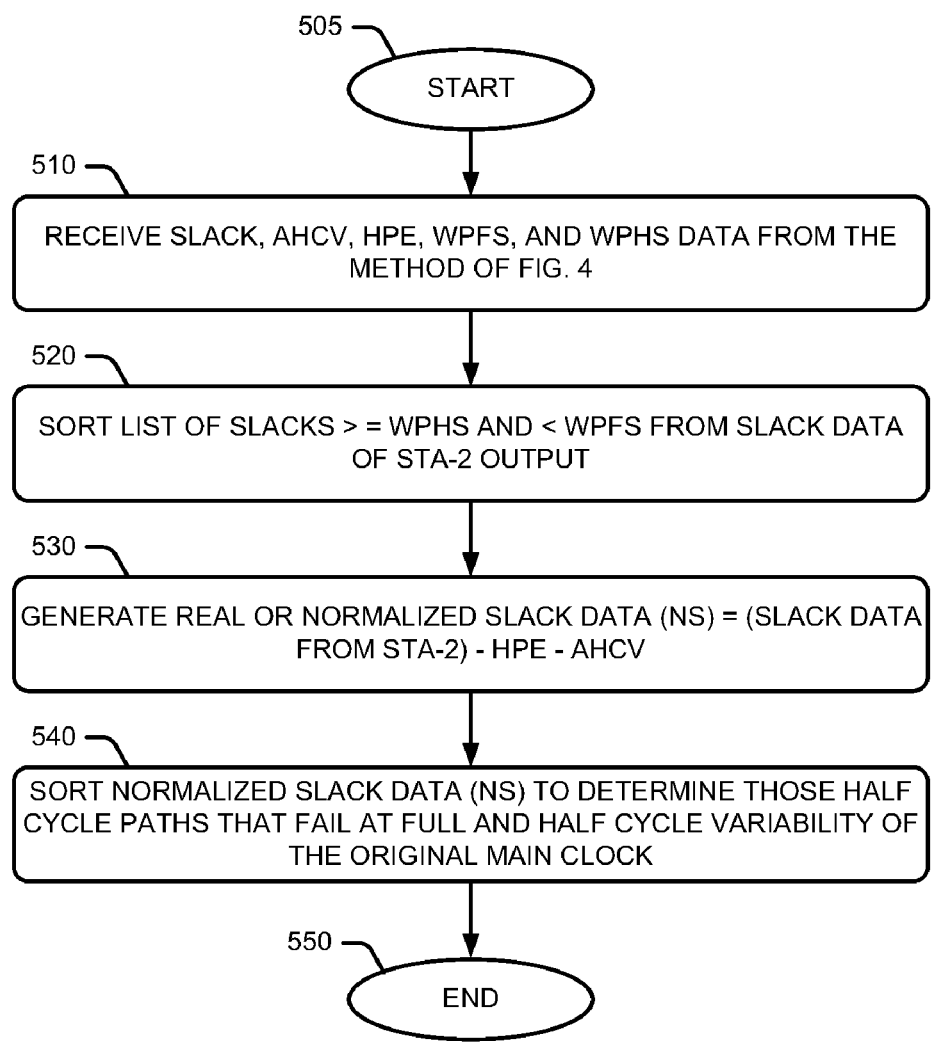
FIG. 5 is a flowchart that shows more process flow in the design model of FIG. 2 as it employs the disclosed clock variability modeling method.

FIG. 5 shows a flowchart that describes one example of a method that further generates "real" or normalized slack data (NS) from the output of the disclosed clock variability modeling method of FIG. 4. The method of generating normalized slack data starts, as per block 505. Designers or modeling system 100 may employ the method of FIG. 5 as a post process method after the execution of the method of FIG. 4. Modeling system 100 may use the output data of STA-1, STA-2, and further the results of the method of FIG. 4 above as input into the post processing of half cycle slack data as described in FIG. 5. A designer receives slack data, AHCV, HPE, WPFS, and WPHS data from the output results of the method of FIG. 4, as per block 510.

A designer or modeling IHS 100 itself sorts the list of slack data as output of STA-2 for that slack data of design model 200 greater than or equal to WPHS and less than WPFS, as per block 520. The results of STA-2 provide the sort of half cycle data path slack failure information. Any half cycle data path with a slack value greater than WPFS or 38, represents a data path with sufficient slack at the initial static timing analysis STA-1. Conversely, any half cycle data path with insufficient slack or less than WPHS or 14 at the original STA-1 analysis will have a slack less than WPFS or 38 during the STA-2 analysis. Any half cycle data path that exhibits a slack less than WPFS during the STA-2 analysis is a slack that indicates a data path failure. That slack data requires normalization to determine the "real" slack data for each half cycle data path slack.

Modeling IHS 100 generates real or normalized slack data (NS) from the slack data output sort of STA-2 by utilizing Equation 5 below, normalized slack data NS=(slack data from STA-2)−HPE−AHCV, as per block 530.

$$NS=(STA\text{-}2 \text{ slack data})-HPE-AHCV, \qquad \text{EQUATION 5}$$

wherein NS=normalized slack data
HPE=half period extension
ACHV=additional half cycle variation For example, if HCDP 245 slack data from STA-2=20, the normalized slack data NS for HCDP 245=20−24−14=−18. In this example, HCDP 245 requires an increase in speed, or reduction in delay of 18 ps to perform properly and enable a non-failure data path capability. In other words, with a reduction of 18 ps in delay, HCDP tolerates a half cycle variability of AHCV or 14 ps. In another embodiment of the disclosed methodology, instead of reducing the delay of HCDP 245 by 18 ps, a designer may increase the main clock MC 310 by 18 ps per half cycle or a period increase of 36 ps for that path to function properly. Designers may execute other remedies or modifications to design model 200 to correct one or multiple particular half cycle data path failures.

Normalized slack data NS indicates those half cycle data paths that would fail during the original STA-1 analysis of design model 200 executing with full cycle variability. In other words, any half cycle data path that indicates failure needs to be sped up by the amount of (−NS) to meet both full cycle clock variability and half cycle clock variability. The normalized slack data NS provides input to hardware designers as an indicator to those half cycle data paths of design model 200 needing more speed or otherwise reductions in their delay characteristics. A designer or modeling IHS 100 sorts the normalized slack data NS to determine those half cycle data paths that fail at the half cycle variability of the original main clock MC 310, as per block 540. The method of FIG. 5, that further generates NS from the output of the method of FIG. 4 for the disclosed clock variability modeling method, ends as per block 550.

FIG. 6 shows a flowchart that describes one example of the generation of half cycle data path slack information. The half cycle data path slack information generation method provides one embodiment for the disclosed clock variability modeling method. A designer or modeling system 100 may use the output of the resultant half cycle data path slack information method for purposes of design improvement of design model 200 or other uses. One embodiment of the disclosed half cycle data path slack information generation method starts, as per block 605. Modeling IHS 100 executes a static timing analysis, STA-1 with a shortened clock cycle SC 340 to model full cycle variability FCV, as per block 610. For example, modeling system 100 may execute a STA-1 run on design model 200, with shortened clock SC 340. The output or results of STA-1 execution provide half and full cycle data path slack data.

Modeling system 100 generates WS and CPE from FCV and AHCV inputs using the method of FIG. 4, as per block 620. The worst case slack WS is the most negative slack data from all data paths during execution of STA-1 on design model 200. Modeling system 100 executes STA-2 with extended clock EC 350 with a period increase by the value of clock period extension CPE, as per block 630. In one embodiment, modeling system 100 executes STA-2 on design model 200 with an extended clock period increase of CPE from the method of FIG. 4 above. That STA-2 run filters out, isolates, or otherwise separates the half cycle data path HCDP slack failure data from the full cycle data path FCDP slack failure data. STA-2 may present a report to the designer of a sort of the worst slack to the best slack in slack magnitude order, or most negative to most positive slack data. With the extended clock EC 350, the slack data will automatically sort out the HCDP data on top or worst, and the FCDP data on bottom or best of the slack data output of the STA-2 run.

Modeling system 100 identifies all HCDP failures from FCDP failures (separated out) from the slack data output of STA-2, as per block 640. The STA-2 slack data automatically adjusts the slack for all half cycle data paths, such as HCDP 245. The STA-2 slack data is worse for failing half cycle data paths, such as HCDP 245, than those of all full cycle data paths, such as FCDP 205. In that manner, the STA-2 slack data for half cycle data paths may be separate from the slack data of full cycle data paths. The AHCV may penalize the data integrity of data paths such as HCDP 245 of design model 200. Modeling system 100 executes the method of FIG. 5 on STA-2 slack data to generate half cycle normalized slack data (NS) for use by designers, as per block 650. In other words, modeling system 100 may execute the method of FIG. 5 above for STA-2 slack data to normalize or otherwise modify the slack data into real slack data for designer interpretation. In one embodiment, designers may use the half cycle normalized slack data NS to make modifications to data paths within design model 200 prior to costly hardware implementation.

The normalized slack data NS reflects the effect of AHCV. In other words, the normalized slack data NS reflects the amount of time that a particular half cycle data path must speed up to meet the main clock MC 310 frequency requirements. That HCDP speed up further reflects the tolerance that designers require of design model 200 half cycle data paths to tolerate half cycle clock variation. In one embodiment, designers speed up half cycle and full cycle data paths independently. In that manner designers may not over-design one path type, such as HCDP 245, at the cost of the other path type repair, such as FCDP 205. The generation of half cycle data path slack information with the disclosed clock variability modeling method ends, as per block 660.

The foregoing teaches how a modeling IHS may employ the disclosed static timing analysis methodology to determine design model half cycle data path slack failures. The modeling IHS may execute static timing analysis software with shortened and extended clock cycles to provide a sort of half cycle data path slack data. Designers may employ the shortened and extended clock cycle as a model for full and half cycle clock variability. A sort of the worst case slack data for half cycle data paths offers designers an opportunity for design modification and design model improvements.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of modeling half cycle clock variation:
performing, by a static timing analyzer, a first static timing analysis (STA-1) on a design model that includes a launch storage element (LSE) and a capture storage element (CSE) with combinational logic therebetween, the design model including full cycle data paths and half cycle data paths, a main clock signal being applied to the launch storage element (LSE) and the capture storage element (CSE), wherein the first static timing analysis (STA-1) is performed using a shortened clock period to model full cycle variability (FCV) to provide slack information including worst case slack information (WS) and half clock cycle variability information (HCV);
determining, by the static timing analyzer, a clock period extension (CPE) value from the worst case slack (WS) information and the half clock cycle variability (HCV) information;
performing, by the static timing analyzer, a second static timing analysis (STA-2) using the clock period extension (CPE) value applied to the main clock signal to generate an extended clock signal and corresponding second static timing analysis (STA-2) slack information; and
identifying, by the static timing analyzer, failing half cycle data paths from the second static timing analysis (STA-2) slack information.

2. The method of claim 1, further comprising:
normalizing, by the static timing analyzer, the second static timing analysis (STA-2) slack information corresponding to the identified half cycle data paths to provide normalized second static timing analysis (STA-2) slack data values.

3. The method of claim 2, further comprising selecting, by the static timing analyzer, from the normalized second static timing analysis (STA-2) slack data values those slack data values that are negative to identify the failing half cycle data paths.

4. The method of claim 2, further comprising separating the failing half cycle data paths from a failing full cycle data path by using second static timing analysis (STA-2) slack data values.

5. The method of claim 2, wherein launch storage element initiates a full cycle data path on a leading edge of the main clock signal and end on a next leading edge of the main clock signal.

6. The method of claim 2, wherein launch storage elements initiate a half cycle data path on a leading edge of the main clock signal and end on a next trailing edge of the main clock signal.

7. The method of claim 1, wherein the launch storage element is a transparent storage element and the capture storage element is a transparent storage element.

8. A modeling system comprising:
a processor;
a memory store, coupled to the processor, configured to:
perform a first static timing analysis (STA-1) on a design model that includes a launch storage element (LSE) and a capture storage element (CSE) with combinational logic therebetween, the design model including full cycle data paths and half cycle data paths, a main clock signal being applied to the launch storage element (LSE) and the capture storage element (CSE), wherein the first static timing analysis (STA-1) is performed using a shortened clock period to model full clock cycle variability (FCV) to provide slack information including worst case slack information (WS) and half clock cycle variability information (HCV);
determine a clock period extension (CPE) value from the worst case slack (WS) information and the half clock cycle variability (HCV) information;
perform a second static timing analysis (STA-2) using the clock period extension (CPE) value applied to the main clock signal to generate an extended clock signal and corresponding second static timing analysis (STA-2) slack information; and
identify failing half cycle data paths from the second static timing analysis (STA-2) slack information.

9. The system of claim 8, wherein the memory store is further configured to normalize the second static timing analysis (STA-2) slack information corresponding to the identified half cycle data paths to provide normalized second static timing analysis (STA-2) slack data values.

10. The system of claim 9, wherein the memory store is further configured to select from the normalized second static timing analysis (STA-2) slack data values those slack data values that are negative to identify the failing half cycle data paths.

11. The system of claim 9, wherein the memory store is further configured to separate the failing half cycle data paths from a failing full cycle data path by using second static timing analysis (STA-2) slack data values.

12. The system of claim 9, wherein the memory store is configured to cause the launch storage element to initiate a full cycle data path on a leading edge of the main clock signal and end on a next leading edge of the main clock signal.

13. The system of claim 9, wherein the memory store is configured to cause the launch storage element to initiate a half cycle data path on a leading edge of the main clock signal and end on a next trailing edge of the main clock signal.

14. The system of claim 8, wherein the launch storage element comprises a first transparent storage element and the capture storage element comprises a second transparent storage element.

15. A computer program product comprising:
a non-transitory computer readable storage medium;
first instructions that perform a first static timing analysis (STA-1) on a design model that includes a launch storage element (LSE) and a capture storage element (CSE) with combinational logic therebetween, the design model including full cycle data paths and half cycle data paths, a main clock signal being applied to the launch storage element (LSE) and the capture storage element (CSE), wherein the first static timing analysis (STA-1) is performed using a shortened clock period to model full clock cycle variability (FCV) to provide slack information including worst case slack information (WS) and half clock cycle variability information (HCV);
second instructions that determine a clock period extension (CPE) value from the worst case slack (WS) information and the half clock cycle variability (HCV) information;
third instructions that perform a second static timing analysis (STA-2) using the clock period extension (CPE) value applied to the main clock signal to generate an extended clock signal and corresponding second static timing analysis (STA-2) slack information; and
fourth instructions that identify failing half cycle data paths from the second static timing analysis (STA-2) slack information;

wherein the first, second, third and fourth program instructions are stored on the non-transitory computer readable storage medium.

16. The computer program product of claim 15, further comprising instructions that normalize the second static timing analysis (STA-2) slack information corresponding to the identified half cycle data paths to provide normalized second static timing analysis (STA-2) slack data values.

17. The computer program product of claim 16, further comprising instructions that select from the normalized second static timing analysis (STA-2) slack data values those slack data values that are negative to identify the failing half cycle data paths.

18. The computer program product of claim 16, further comprising instructions that separate the failing half cycle data paths from a failing full cycle data path by using second static timing analysis (STA-2) slack data values.

19. The computer program product of claim 16, further comprising instructions that cause the launch storage element to initiate a full cycle data path on a leading edge of the main clock signal and end on a next leading edge of the main clock signal.

20. The computer program product of claim 16, further comprising instructions that cause the launch storage element to initiate a half cycle data path on a leading edge of the main clock signal and end on a next trailing edge of the main clock signal.

* * * * *